US009263566B2

(12) United States Patent
Mieno (10) Patent No.: US 9,263,566 B2
(45) Date of Patent: Feb. 16, 2016

(54) SEMICONDUCTOR DEVICE AND MANUFACTURING METHOD THEREOF

(75) Inventor: Fumitake Mieno, Beijing (CN)

(73) Assignee: SEMICONDUCTOR MANUFACTURING INTERNATIONAL (BEIJING) CORPORATION, Beijing (CN)

(*) Notice: Subject to any disclaimer, the term of this patent is extended or adjusted under 35 U.S.C. 154(b) by 864 days.

(21) Appl. No.: 13/351,139

(22) Filed: Jan. 16, 2012

(65) Prior Publication Data

US 2013/0020655 A1   Jan. 24, 2013

(30) Foreign Application Priority Data

Jul. 19, 2011   (CN) .......................... 2011 1 0201271
Jul. 19, 2011   (CN) .......................... 2011 1 0201413

(51) Int. Cl.
*H01L 21/28*   (2006.01)
*H01L 23/498*   (2006.01)
*H01L 29/43*   (2006.01)
*H01L 29/778*   (2006.01)
*H01L 29/66*   (2006.01)
*H01L 29/10*   (2006.01)
(Continued)

(52) U.S. Cl.
CPC ...... *H01L 29/7781* (2013.01); *H01L 21/28255* (2013.01); *H01L 29/1054* (2013.01); *H01L 29/66545* (2013.01); *H01L 29/66651* (2013.01); *H01L 29/165* (2013.01); *H01L 29/4983* (2013.01)

(58) Field of Classification Search
CPC ..................... H01L 21/28255; H01L 29/1054; H01L 29/165; H01L 29/66651
See application file for complete search history.

(56) References Cited

U.S. PATENT DOCUMENTS 7,615,458 B2   11/2009   Jain et al.
2005/0280102 A1   12/2005   Oh et al.
2006/0068590 A1   3/2006   Lindert et al.
(Continued)

FOREIGN PATENT DOCUMENTS

CN   1624932   6/2005
CN   1898785   1/2007
(Continued)

OTHER PUBLICATIONS

"Characterization of Thin Surface Films on Germanium in Various Solvents by Ellipsometry", M.F. Ehman, et al., Journal of Materials Science 6 (1971), pp. 969-973.
(Continued)

*Primary Examiner* — Ha Tran T Nguyen
*Assistant Examiner* — Raj R Gupta
(74) *Attorney, Agent, or Firm* — Koppel, Patrick, Heybl & Philpott (57) ABSTRACT

The present invention relates to a semiconductor device and its manufacturing method. The semiconductor device comprises: a gate structure located on a substrate, Ge-containing semiconductor layers located on the opposite sides of the gate structure, a doped semiconductor layer epitaxially grown between the Ge-containing semiconductor layers, the bottom surfaces of the Ge-containing semiconductor layers located on the same horizontal plane as that of the epitaxial semiconductor layer. The epitaxial semiconductor layer is used as a channel region, and the Ge-containing semiconductor layers are used as source/drain extension regions.

8 Claims, 9 Drawing Sheets

(51) Int. Cl.
*H01L 29/49* (2006.01)
*H01L 29/165* (2006.01)

(56) References Cited

U.S. PATENT DOCUMENTS

| | | | |
|---|---|---|---|
| 2006/0180854 A1* | 8/2006 | Hsu et al. | 257/329 |
| 2007/0228486 A1 | 10/2007 | Tsuchiya et al. | |
| 2010/0224938 A1* | 9/2010 | Zhu | 257/369 |
| 2012/0025266 A1* | 2/2012 | Griebenow et al. | 257/190 |
| 2012/0261754 A1* | 10/2012 | Cheng et al. | 257/347 |

FOREIGN PATENT DOCUMENTS

| | | |
|---|---|---|
| CN | 101006569 | 7/2007 |
| CN | 101027763 | 8/2007 |
| JP | 2005056900 | 3/2005 |
| WO | WO 2005041288 | 5/2005 |
| WO | WO 2006026010 | 3/2006 |

OTHER PUBLICATIONS

"Dissolution of Germanium in Aqueous Hydrogen Peroxide Solution", N. Cerniglia, et al., Journal of the Electrochemical Society, vol. 109, No. 6 (1962), pp. 508-512.

Office Action from Chinese Patent Application No. 201110201271.X, dated Aug. 12, 2014.

Office Action from Chinese Patent Application No. 201110201413.2, dated Jul. 30, 2014.

Second Office Action from corresponding Chinese Patent Application No. 201110201271.X, dated Mar. 25, 2015.

* cited by examiner

SEMICONDUCTOR DEVICE AND MANUFACTURING METHOD THEREOF

CROSS-REFERENCE TO RELATED APPLICATIONS

This application claims priorities to Chinese Patent Application No. 201110201271.X, filed on Jul. 19, 2011 and entitled "Semiconductor Device and Manufacturing Method Thereof" and Chinese Patent Application No. 201110201413.2, filed on Jul. 19, 2011 and entitled "Semiconductor Device and Manufacturing Method Thereof", which are incorporated herein in their entirety by reference.

BACKGROUND OF THE INVENTION

1. Field of the Invention

The present invention relates to a semiconductor device and manufacturing methods therefor. More particularly, the present invention relates to a semiconductor device with epitaxial source-drain extension regions and a manufacturing method therefor.

2. Description of the Related Art

Nowadays, millions of semiconductor devices are integrated together to construct very large scale integrated circuits.

Figure 1:
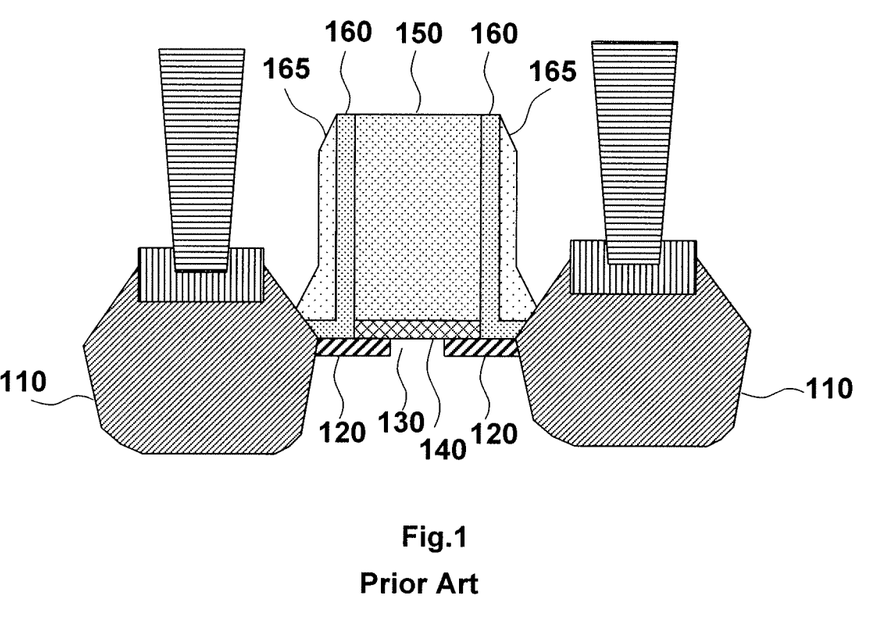
FIG. 1 is a cross-sectional view schematically showing a conventional semiconductor device.

FIG. 1 shows a sectional view of a conventional semiconductor device (transistor). A transistor typically comprises a gate dielectric layer 140 on a semiconductor substrate (not shown for conciseness) and a gate layer 150 on the gate dielectric layer 140, the transistor has first and second sidewall spacers 160, 165 formed on the sidewalls of the gate dielectric layer 140 and the gate layer 150. Commonly, the transistor also comprises a pair of source/drain regions 110 aligned with the peripheral borders of the second sidewall spacers 165. Further, a pair of source/drain extension regions 120 is formed within the surface region of the semiconductor substrate, extending beneath the gate dielectric layer 140 and the gate layer 150. A channel region 130 is formed in the semiconductor substrate between the pair of extension regions 120 and beneath the gate dielectric layer 140.

With the continuing reduction of characteristic dimensions of transistors, it is desired for the source/drain extension regions 120 to have a shallow junction depth in order to reduce area junction capacitance ($C_{junc}$). Also, it is desired for the source/drain extension regions 120 to have a high activated dopant concentration to reduce accumulation resistance ($R_{acc}$) and thus increase the transistor driving current.

To achieve the above objects, commonly, annealing, especially laser melting/sub-melting annealing, is applied to the source/drain extension regions formed through ion implantation.

However, it has been found by the inventors of the present invention through intensive research that there is still a need to improve junction depth and activated dopant concentration for the source/drain extension regions 120 formed through ion implantation and laser melting/sub-melting annealing. However, while SIMS (Secondary Ion Mass Spectrometry) is often used to measure dopant distribution after laser melting/sub-melting annealing, SIMS is unable to identify whether a dopant is activated.

Therefore, it has been recognized by the inventors of the present invention that there is a need for a semiconductor device having a shallow junction depth (or a small thickness) for the source/drain extension regions and a high activated dopant concentration, as well as a manufacturing method for manufacturing such a semiconductor device.

SUMMARY OF THE INVENTION

The present invention is proposed in view of the above problems.

An object of the present invention is to provide a semiconductor device having a shallow junction depth (or small thickness) of source/drain extension regions and a high activated dopant concentration, and a manufacturing method therefor.

According to a first aspect of the present invention, there is provided a semiconductor device, comprising: a gate structure located on a substrate; a first portion and a second portion of a Ge-containing semiconductor layer located on the opposite sides of the gate structure; a doped semiconductor layer epitaxially grown between the first portion and second portion of the Ge-containing semiconductor layer; such that the bottom surface of the Ge-containing semiconductor layer is located on the same horizontal plane as that of the epitaxial semiconductor layer; wherein the epitaxial semiconductor layer serves as a channel region, and the first portion and second portion of the Ge-containing semiconductor layer function as a source/drain extension region.

Preferably, the Ge-containing semiconductor layer is a P-type doped Ge epitaxial layer, having a doping concentration of 1E15-1E17 $cm^{-3}$.

Preferably, the doped epitaxial semiconductor layer is N-type doped Ge epitaxial layer, having a doping concentration of 1E13-1E15 $cm^{-3}$.

Preferably, the epitaxial semiconductor layer and the Ge-containing semiconductor layer both have a thickness of 5-50 nm.

Preferably, the semiconductor device is a PMOS transistor.

Preferably, the semiconductor device further comprises a high K gate dielectric layer and a metal gate layer located on the doped epitaxial semiconductor layer.

Preferably, the high K gate dielectric layer forms a U shape along the bottom and sidewalls of the metal gate layer.

Preferably, the epitaxial semiconductor layer and the Ge-containing semiconductor layer both have a thickness of 20 nm.

According to another aspect of the present invention, there is provided a method of manufacturing a semiconductor device, comprising the following steps: forming a Ge-containing semiconductor layer on a semiconductor substrate; forming a patterned stack on the Ge-containing semiconductor layer, sequentially comprising from bottom to top a gate dielectric layer and a gate layer on the Ge-containing semiconductor layer; forming sidewall spacers and interlayer dielectric layers on the opposite sides of the stack; removing the gate dielectric layer and the gate layer to expose the underlying Ge-containing semiconductor layer; removing the exposed Ge-containing semiconductor layer to expose the semiconductor substrate; and epitaxially growing a doped epitaxial semiconductor layer on the exposed semiconductor substrate.

Preferably, the Ge-containing semiconductor layer is a P-type doped Ge epitaxial layer, having a doping concentration of 1E15-1E17 $cm^{-3}$.

Preferably, the doped epitaxial semiconductor layer is a N-type doped Ge epitaxial layer, having a doping concentration of 1E13-1E15 $cm^{-3}$.

Preferably, both the epitaxial semiconductor layer and the Ge-containing semiconductor layer have a thickness of 5-50 nm.

Preferably, after forming the epitaxial semiconductor layer, further comprising: forming a high K gate dielectric layer and a metal gate layer on the epitaxial semiconductor layer.

Preferably, both of the epitaxial semiconductor layer and the Ge-containing semiconductor layer have a thickness of 20 nm.

Preferably, the step of removing the exposed portion of the Ge-containing semiconductor layer to expose at least a portion of the substrate comprises: carrying out the step of removing the exposed Ge-containing semiconductor layer through a reactive ion etching process.

Preferably, the high K gate dielectric layer forms a U shape along the bottom and sidewalls of the metal gate layer.

According to yet another aspect of the present invention, there is provided a semiconductor device, comprising: a patterned stack formed on a semiconductor substrate, which comprises from bottom to top a Ge semiconductor layer, a gate dielectric layer and a gate layer; a doped epitaxial semiconductor layer selectively and epitaxially grown on the opposite sides of the Ge semiconductor layer, wherein the epitaxial semiconductor layer serves as raised source/drain extension regions, and the Ge semiconductor layer functions as a channel region.

Preferably, the epitaxial semiconductor layer has a doping concentration of $5.0\times10^{19}$-$5.0\times10^{21}$ cm$^{-3}$.

Preferably, the epitaxial semiconductor layer has a thickness of 5-50 nm.

Preferably, the semiconductor device is a PMOS transistor.

Preferably, the epitaxial semiconductor layer is a Ge layer.

Preferably, the Ge semiconductor layer is undercut with respect to the gate dielectric layer, and the undercut length of the Ge semiconductor layer is 10-20% of the length of the gate.

Preferably, the gate dielectric layer and the gate layer are substituted by a high K gate dielectric layer and a metal gate layer, respectively.

Preferably, the high K gate dielectric layer is in a U shape, and the metal gate layer is surrounded by the high K gate dielectric layer.

According to another aspect of the invention, a semiconductor device is provided comprising: a patterned stack formed on a semiconductor substrate, which comprises from bottom to top a Ge semiconductor layer, a gate dielectric layer and a gate layer; a doped epitaxial semiconductor layer selectively and epitaxially grown on the opposite sides of the Ge semiconductor layer, wherein the epitaxial semiconductor layer serves as raised source/drain extension regions, and the Ge semiconductor layer functions as a channel region.

Preferably, the epitaxial semiconductor layer has a doping concentration of $5.0\times10^{19}$-$5.0\times10^{21}$ cm$^{-3}$.

Preferably, the epitaxial semiconductor layer has a thickness of 5-50 nm.

Preferably, the semiconductor device is a PMOS transistor.

Preferably, the epitaxial semiconductor layer is a Ge layer.

Preferably, the Ge semiconductor layer is undercut with respect to the gate dielectric layer, and the undercut length of the Ge semiconductor layer is 10-20% of the length of the gate.

Preferably, the gate dielectric layer and the gate layer are substituted by a high K gate dielectric layer and a metal gate layer, respectively.

Preferably, the high K gate dielectric layer is in a U shape, and the metal gate layer is surrounded by the high K gate dielectric layer.

Preferably, the method comprises the following steps: forming a patterned stack on a semiconductor substrate, the stack comprising from bottom to top a Ge semiconductor layer, a gate dielectric layer and a gate layer; selectively and epitaxially growing a doped epitaxial semiconductor layer on the opposite sides of the Ge semiconductor layer to form raised source/drain extension regions; and substituting the gate dielectric layer and the gate layer by a high K gate dielectric layer and a metal gate layer respectively, while the remaining Ge semiconductor layer serves as a channel region.

Preferably, the epitaxial semiconductor layer has a doping concentration of $5.0\times10^{19}$-$5.0\times10^{21}$ cm$^{-3}$.

Preferably, the epitaxial semiconductor layer has a thickness of 5-50 nm.

Preferably, the semiconductor device is a PMOS transistor.

Preferably, the epitaxial semiconductor layer is a Si layer.

Preferably, the selectively epitaxial growth is carried out under the following conditions: the flow rate of $H_2$ is 10-50 slm; the flow rate of $GeH_4$ is 100-300 sccm; the flow rate of a mixture of $AsH_3$ and $H_2$ with a molar ratio 1:99, a mixture of $B_2H_6$ and $H_2$ with a molar ratio 1:99, or a mixture of $PH_3$ and $H_2$ with a molar ratio 1:99 is about 90 SCCM; the temperature is about 530° C. and the pressure is about 0.07 torr.

Preferably, the manufacturing method further comprises the following step: after forming the stack and before forming the raised source/drain extension regions, undercutting the opposite sides of the Ge semiconductor layer with respect to the gate dielectric layer by etching, wherein the total undercut length is 10-20% of the length of the gate.

Preferably, the Ge semiconductor layer is etched at room temperature with a mixture of $H_2O_2$ and $H_2O$ with a molar rate of 3:97.

Preferably, the step of substituting the gate dielectric layer and the gate layer with a high K gate dielectric layer and a metal gate layer comprises the following steps: forming sidewall spacers on the stack; removing the gate layer and the gate dielectric layer to form a recess between the sidewall spacers; forming a high K gate dielectric layer covering the bottom and sidewalls of the recess; and forming a metal gate layer surrounded by the high K gate dielectric layer.

Preferably, the manufacturing method further comprises: forming source and drain regions immediately subsequent to forming the sidewall spacers.

BRIEF DESCRIPTION OF THE DRAWINGS

The accompanying drawings, which are incorporated in and constitute a part of the specification, illustrate embodiments of the invention and, together with the description, serve to explain the principles of the invention.

Note that, in these drawings, for the simplicity of description, the shape of each part is merely illustrative and each of those parts may not be drawn to scale.

DESCRIPTION OF THE EMBODIMENTS

Various exemplary embodiments of the present invention are described in detail with reference to the drawings. It should be noted that the relative arrangement of the components and steps, the numerical expressions, and numerical values set forth in these embodiments do not limit the scope of the present invention unless it is specifically stated otherwise. Furthermore, techniques, methods and apparatus as known by one of ordinary skill in the relevant art may not be discussed in detail but are intended to be part of the specification where appropriate.

The present invention will be described below using transistors as an example. Those skilled in the art, based on the description herein, will find that the invention is applicable to other applications within the spirit and substance of the invention described herein.

Figure 2:
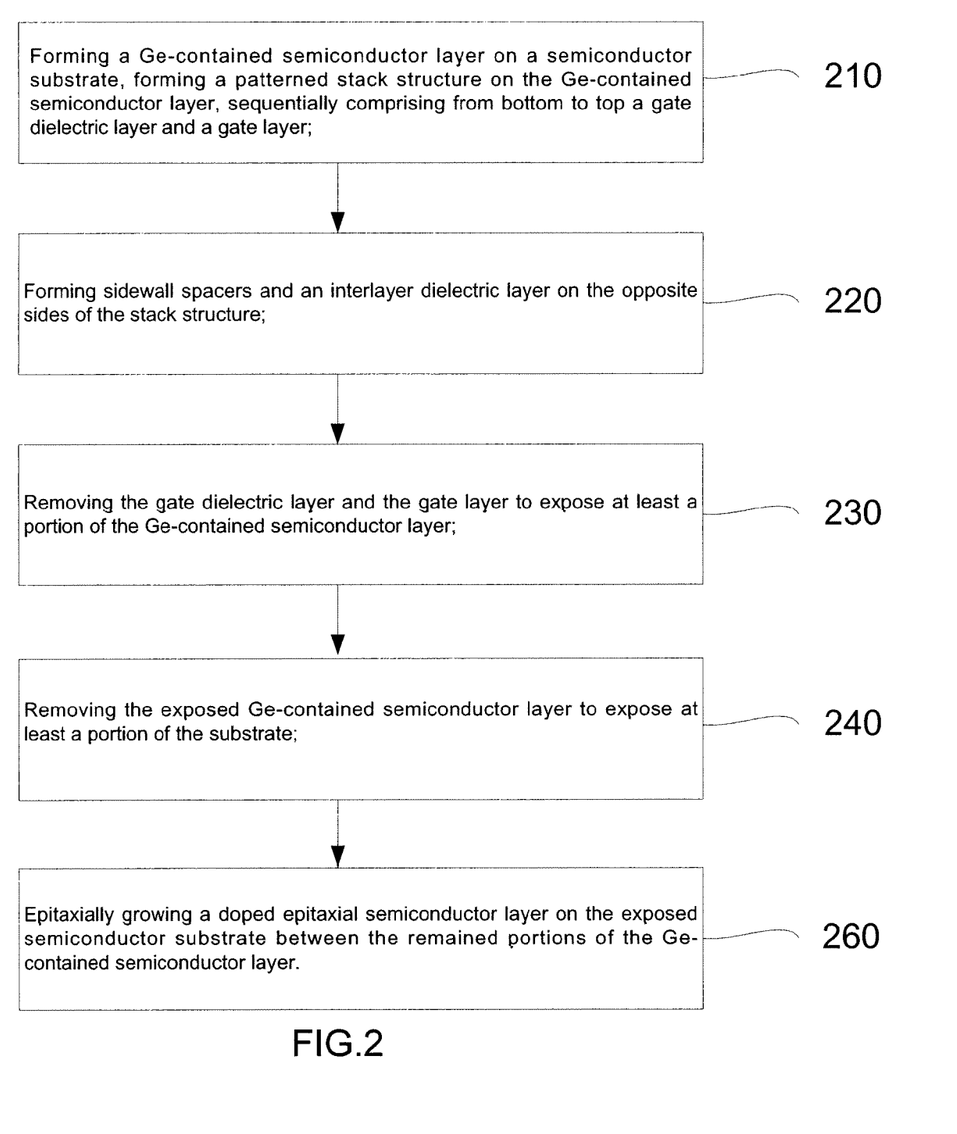
FIG. 2 is a flow chart schematically showing a method of manufacturing a semiconductor device according to a first embodiment of the present invention.

An embodiment of a semiconductor device manufacturing method according to the present invention is described in detail with reference to FIG. 2 and FIGS. 3A-3F wherein, FIG. 2 schematically shows a flow chart of a first embodiment. FIGS. 3A-3F schematically show sectional views of various steps of the first embodiment. Note that it is not necessary to include every step in FIG. 2 and some of these steps can be omitted as appropriate.

Figure 3A:
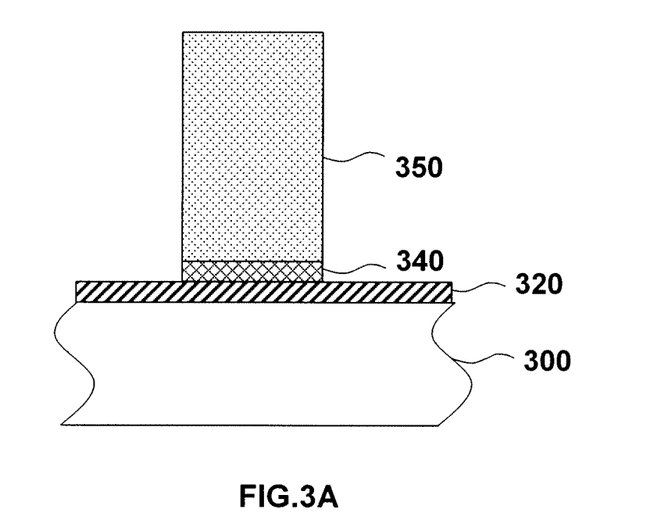
FIGS. 3A-3F are cross-sectional views schematically showing various steps of the method of manufacturing a semiconductor device according to the first embodiment of the present invention.

First, at step 210 of FIG. 2, a Ge-containing semiconductor layer 320 is formed on a semiconductor substrate 300, and a patterned stack is formed on the Ge-containing semiconductor layer 320, which comprises sequentially from bottom to top a gate dielectric layer 340 and a gate layer 350 (see FIG. 3A).

The semiconductor substrate 300 can be any kind of substrate known in the art, such as a bulk Si substrate, a Si-on-insulator (SOI) substrate and the like. In addition, multiple separated regions can be formed in the semiconductor substrate 300, such as STI (shallow trench isolation) regions (not shown).

While alternate materials can be used, the material of the Ge-containing semiconductor layer 320, is preferably in a crystal state and can match the epitaxial semiconductor layer to be formed later. For example, the Ge-containing semiconductor layer 320 can be a SiGe layer, wherein the concentration of Ge is 30-40 atoms %. Further, the Ge-containing semiconductor layer 320 may, for example, have a thickness of 5-50 nm. In some embodiments of the present invention, the Ge-containing semiconductor layer 320 may have a thickness less than 20 nm, or even less than 10 nm. As described below, the Ge-containing semiconductor layer 320 will function as raised source/drain extension regions after a series of processes. The type of dopant added to the GE-containing semiconductor layer 320 can be appropriately selected depending on the type of MOS transistors to be manufactured. For example, $AsH_3$ and $PH_3$ can be used as dopants in forming NMOS transistors; and $B_2H_6$ can be used as a dopant in forming PMOS transistors.

In one embodiment, the Ge-containing semiconductor layer 320 is a p-type doped Ge epitaxial layer. Those skilled in the art may select appropriate processes to form the p-doped Ge epitaxial layer. In one embodiment, the Ge epitaxial layer is formed, for example, under the following conditions: the flow rate of $H_2$ is 10-50 SLM, such as 30 SLM; the flow rate of $GeH_4$ serving as a Ge source is 100-300 SCCM; optionally, HCL also can be introduced, the flow rate of which is, for example, 10-100 SCCM; a $B_2H_6$ and $H_2$ mixture of molar ratio 1:99, the flow rate of which is 100-500 SCCM; the temperature is about 400-600° C. with about 0.05-1.0 torr.

While alternate materials can be used, the material of the gate dielectric layer 340, can be for example, a silicon oxide or silicon nitride.

While alternative materials can be used, the material of the gate layer 350, can be for example, polycrystalline silicon.

Using methods known in the art, the stack can be formed through deposition, patterning and etching, etc.

Figure 3B:
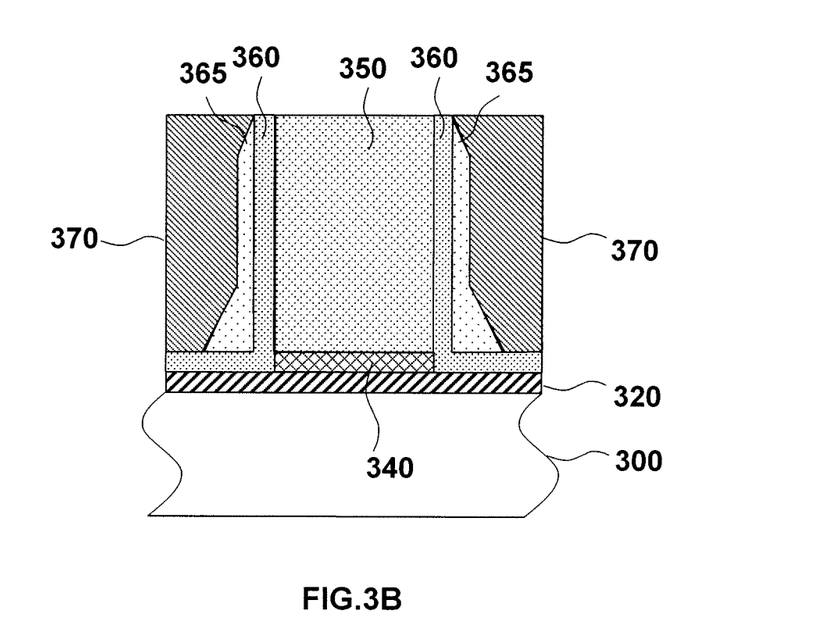

Next, at step 220 of FIG. 2, referring to FIG. 3B, first and second sidewall spacers 360, 365, and an interlayer dielectric layer 370 are formed on the opposite sides of the gate layer 350.

While alternative materials can be used, the materials and method of forming the sidewall spacers 360, 365 and the interlayer dielectric layer 370, the sidewall spacers 360 and 365 can for example, be made of a silicon nitride or a silicon oxide, respectively, and can be formed through atom layer deposition (ALD) which has excellent coverage and lower process temperature. After forming the first and second sidewall spacers 360, 365 through deposition and etching, the interlayer dielectric layer 370 is deposited, and is then polished through chemical mechanical polishing (CMP) to obtain the structure shown in FIG. 3B.

Figure 3C:
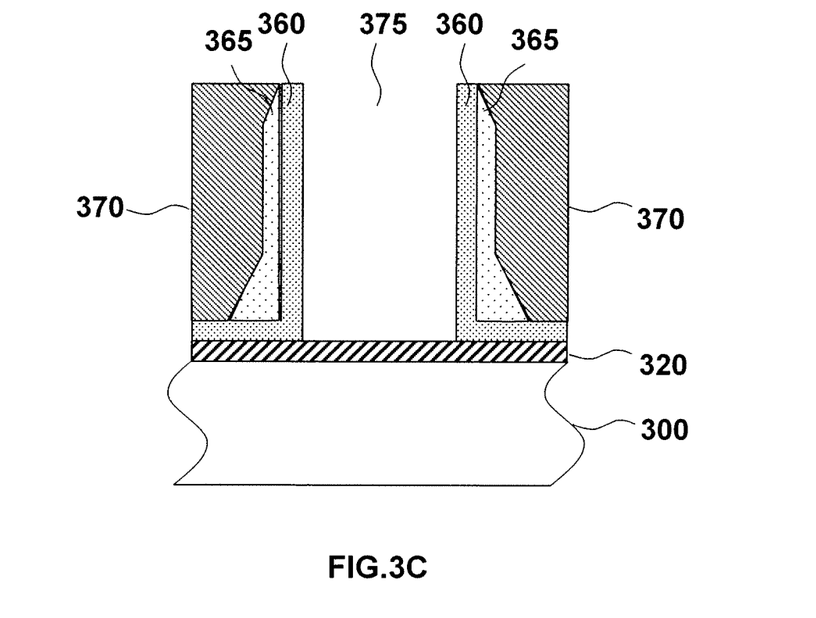

Thereafter, at the step 230 of FIG. 2, the gate layer 350 and the gate dielectric layer 340 are removed to expose a portion of the Ge-containing semiconductor layer 320, thus forming a recess 375 (see FIG. 3C).

While alternative materials can be used, the method of removing the gate layer 350 and the gate dielectric layer 340, for example, can use various methods including dry etching and wet etching to selectively etch off the gate layer 350 and the gate dielectric layer 340 to form the recess 375, so as to expose at least a portion of the Ge-containing semiconductor layer 320. In one embodiment, the Ge-containing semiconductor layer 320 is etched with the spacer 360 as a mask, such that a portion of the Ge-containing semiconductor layer 320 is removed at the bottom of the recess 375.

Figure 3D:
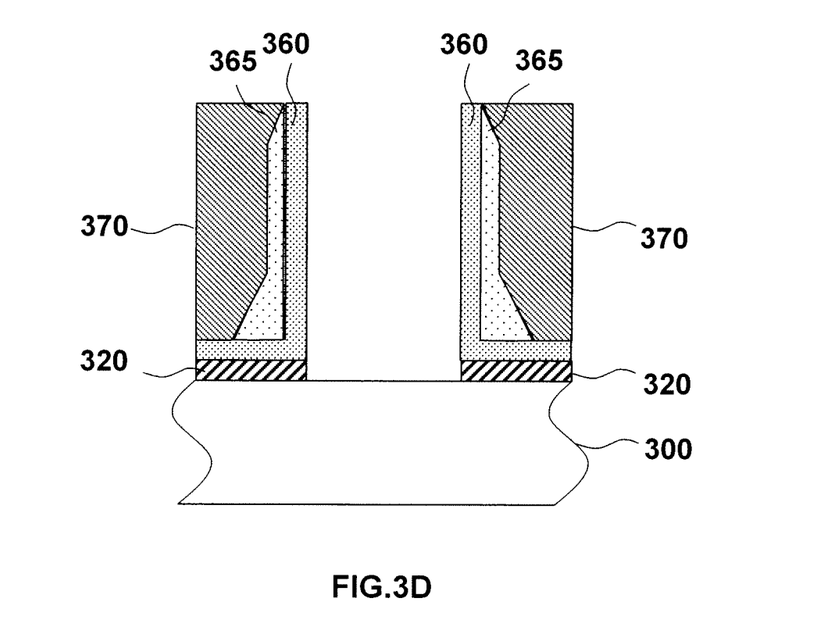

Next, at step 240 of FIG. 2, the exposed Ge-containing semiconductor layer 320 is etched to expose a portion of the substrate 300, while retaining portions of the Ge-containing semiconductor layer 320 on the opposite sides of the exposed substrate (see FIG. 3D). In one embodiment, the entire Ge-containing semiconductor layer 320 exposed at the bottom of the recess 375 is removed.

Etching the Ge-containing semiconductor layer 320 can be performed under the following conditions: the etching can be performed at room temperature using a $H_2O_2$ and $H_2O$ mixture of 3:97 to 30:70 molar ratio. More specific details about the etching process of the Ge-containing semiconductor layer 320 can be found in N. Cerniglia and P. Wang "Dissolution of Germanium in Aqueous Hydrogen Peroxide Solution," Journal of the Electrochemical Society, Vol. 109, No. 6 (1962) pp 508-512; and M. F. EHMAN, at al. "Characterisation of Thin Surface Films on Germanium in Various Solvents by Ellipsometery," Journal of materials science, 6 (1971), pp 969-973. The Ge-containing semiconductor layer 320 can be etched through reactive ion etching.

When the Ge-containing semiconductor layer 320 is a SiGe layer, the layer 320 can be etched, for example, under the following conditions: the flow rate of HCL vapour is about 200 SCCM; the flow rate of $H_2$ is about 10 SLM; the temperature is about 650° C.; the pressure is about 760 torr. Those skilled in the art can select other appropriate etching methods.

Figure 3E:
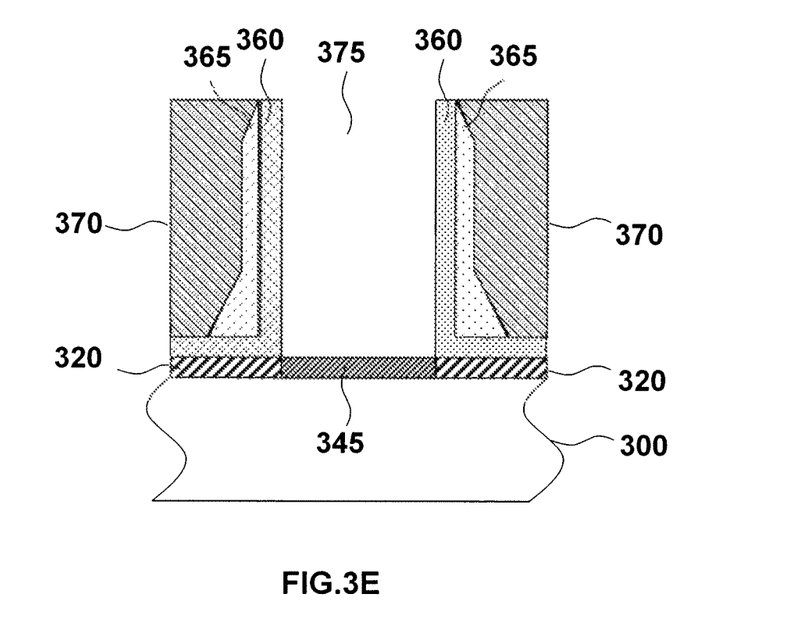

At step 260 of FIG. 2, as shown in FIG. 3E, a doped semiconductor layer 345 is epitaxially grown on the exposed portion of substrate between the retained portions of the Ge-containing semiconductor layer 320. In one embodiment, the doped epitaxial semiconductor layer 345 is an N-type doped Ge epitaxial layer, having a doping concentration of 1E13-1E15 cm$^{-3}$. The step of selective epitaxial growth merely occurs at positions where "seed" atoms exist. Thus, the doped epitaxial semiconductor layer 345 is selectively and epitaxially grown between the portions of the Ge-containing semiconductor layer 320 on the opposite sides of the recess 375.

In one embodiment, the selective epitaxial growth is performed under the following conditions: the flow rate of GeH$_4$ serving as a Ge source is 50-200 SCCM, such as 100 SCCM; the flow rate of HCl is, for example, 30-100 SCCM; the flow rate of H$_2$ is 10-20 SLM, such as 10 SLM; the temperature is about 550-700° C. and the pressure is about 0.1-0.3 torr.

When the epitaxial semiconductor layer 345 is a SiGe layer, in one embodiment, the selective epitaxial growth is carried out under the following conditions: the flow rate of SiH$_4$ is 50-300 SCCM; the flow rate of GeH$_4$ is 50-200 SCCM; the flow rate of HCl is 30-100 SCCM; the flow rate of H$_2$ is 10-20 SLM, such as 10 SLM; the temperature is about 550-700° C. and the pressure is about 0.1-0.3 torr.

Figure 3F:
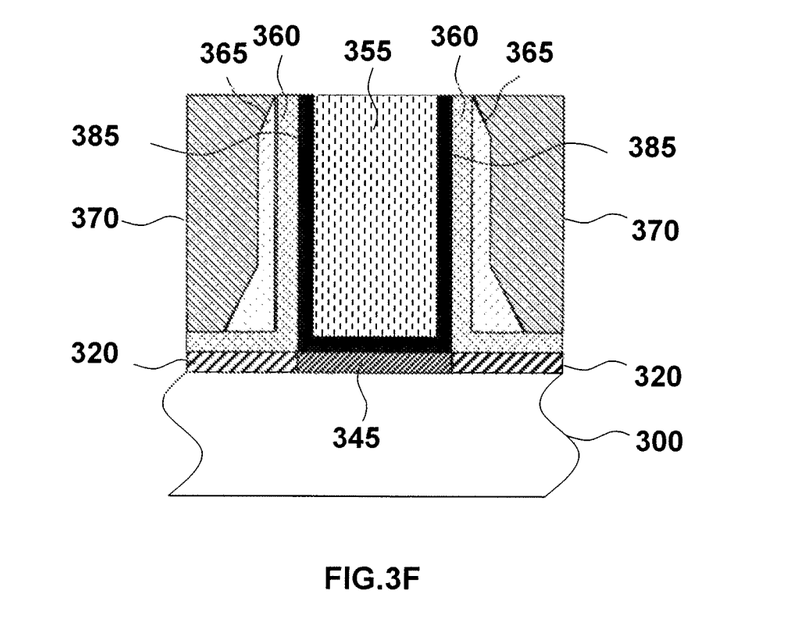

Next, a high K gate dielectric layer 385 and a metal gate layer 355 are formed in sequence in the recess 375 (see FIG. 3F).

While alternative materials can be used, the material of the high K gate dielectric layer 385, can for example, be HfO, HfSiO, LaO, ZrO, ZrSiO, TaO, BST, BaTiO, SrTiO, YO, AlO, PbScTaO, PbZnNb and the like. The high K gate dielectric layer 355 has a thickness of, for example, less than 60 Å. As shown in FIG. 3F, the resultant high K gate dielectric layer 385 covers not only the bottom of the recess 375, but also the sidewalls of the recess 375. In other words, the high K gate dielectric layer 385 substantially forms a U-shape.

After forming the high K gate dielectric layer 385 as a lining layer in the recess 375, a metal gate layer 355 is deposited in the recess 375 and planarized, so as to obtain a structure shown in FIG. 3F of the substantially U-shaped high K gate dielectric layer 385. The metal gate layer 355 is surrounded by the high K gate dielectric layer 385. While alternative materials can be used, the material for the metal gate layer 355, for an n-type metal gate layer 355, it can be of Hf, Zr, Ti, Ta, Al, HfC, ZrC, TiC, TaC, AlC and the like, having a work function of about 3.9-4.2 eV, and a thickness of about 100-2000 Å. For a p-type metal gate layer 355, it can be made, for example, of Ru, Pa, Pt, Co, Ni, RuO and the like, having a work function of about 4.9-5.2 eV, and a thickness of about 50-1000 Å.

A semiconductor device is formed through the above processes (see FIG. 3F), in which, different from the semiconductor device shown in FIG. 3B, the gate dielectric layer 340 and the gate layer 350 are substituted with the high K gate dielectric layer 385 and the metal gate layer 355.

In the above process where the high K dielectric and gate are formed last according to the first embodiment of the present invention, the high K gate dielectric layer 385 is formed after forming the epitaxial semiconductor layer 320 which is then used as source/drain extension regions, so as to avoid degradation of the high K dielectric layer caused by reducing gases released during the epitaxial growth. In contrast, in a process where the high K dielectric layer and gate are formed first, when forming source/drain extension regions through an epitaxial method, the high K dielectric layer will be degraded due to the reductive reaction of the high K dielectric layer caused by reducing gases released during the epitaxial growth.

Figure 4:
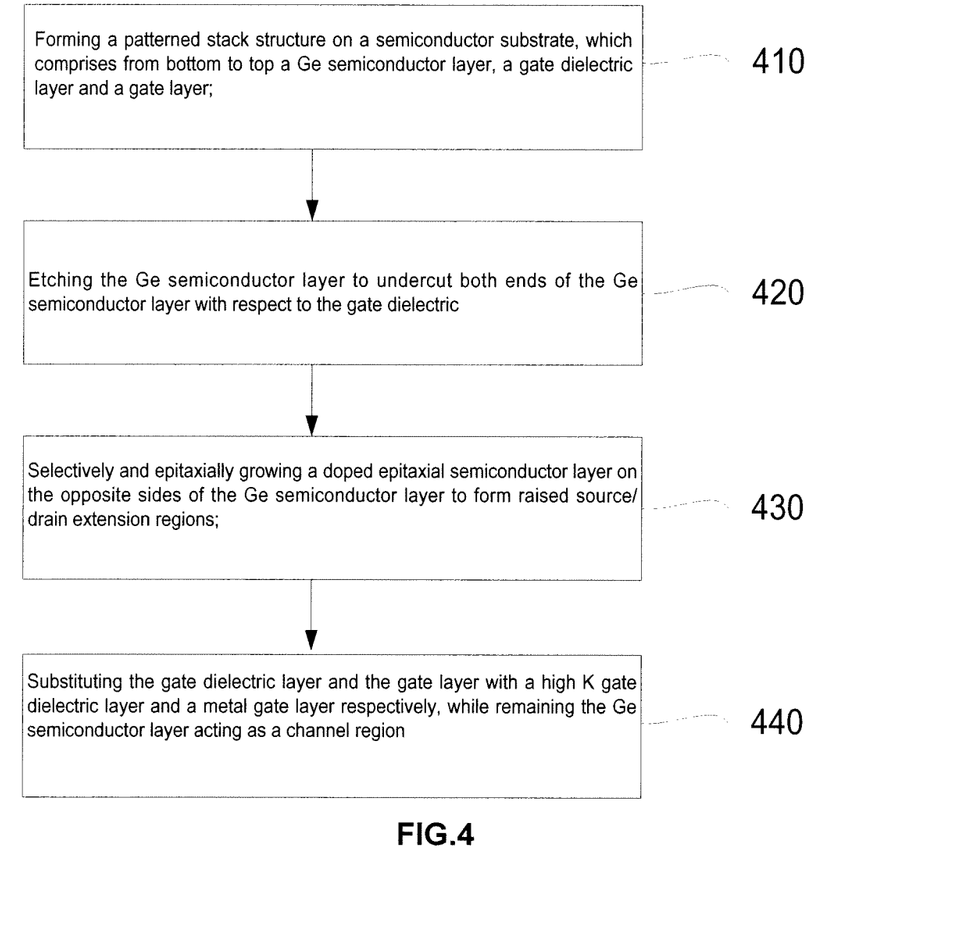
FIG. 4 is a flow chart schematically showing a method of manufacturing a semiconductor device according to a second embodiment of the present invention.

Next, a semiconductor device manufacturing method according to a second embodiment of the present invention is described in detail with reference to FIG. 4 and FIGS. 5A-5F. Wherein, FIG. 4 schematically shows a flow chart of the second embodiment. FIGS. 5A-5F schematically show sectional views of various steps of the second embodiment. Note that every step is not included in FIG. 4 and some of these steps can be omitted as appropriate.

Figure 5A:
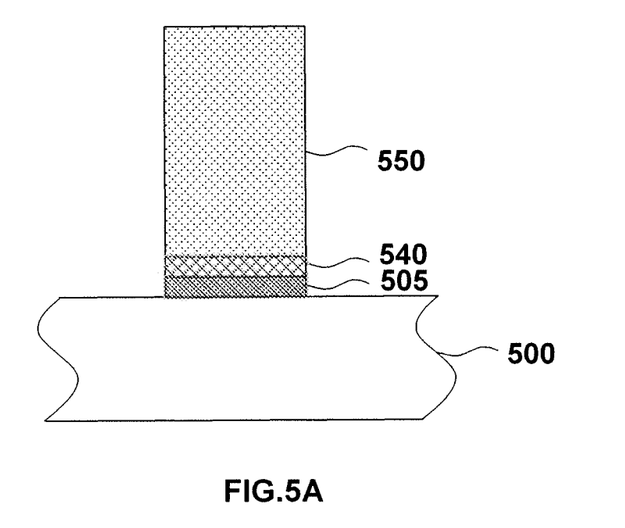
FIGS. 5A-5F are sectional views schematically showing various steps of the method of manufacturing a semiconductor device according to the second embodiment of the present invention.

First, at step 410 of FIG. 4, a patterned stack is formed on a semiconductor substrate 500, the stack comprising sequentially from bottom to top a Ge semiconductor layer 505, a gate dielectric layer 540, and a gate layer 550 (see FIG. 5A).

The semiconductor substrate 500 can be any kind of substrate known in the art, such as a bulk Si substrate, a Si-on-insulator (SOI) substrate and the like. In addition, multiple isolation regions can be formed in the semiconductor substrate 500, such as STI (shallow trench isolation) regions (not shown).

The Ge semiconductor layer 505 may have a thickness of 5-50 nm. In some embodiments of this invention, the thickness of the Ge semiconductor layer 505 is less than 20 nm, or even less than 10 nm.

While alternative materials can be used, the material of the gate dielectric layer 540, can be for example, a silicon oxide or silicon nitride.

While alternative materials can be used, the material of the gate layer 550, can be for example, polycrystalline silicon.

The stacked structure can be formed using methods known in the art such as deposition, patterning and etching, etc.

Figure 5B:
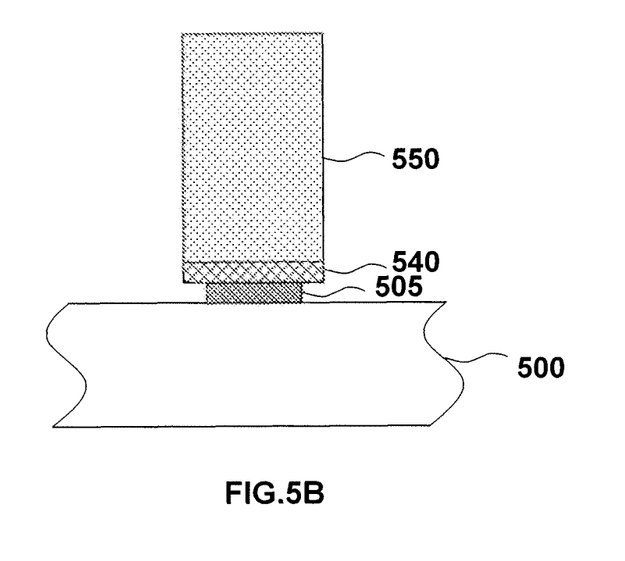

Next, at step 420 of FIG. 4, the Ge semiconductor layer 505 is etched to undercut both edges of the Ge semiconductor layer 505 with respect to the gate dielectric layer 540 (see FIG. 5B).

The Ge semiconductor layer 505 is undercut at both of its ends so that the epitaxial semiconductor layer to be formed later and the gate structure overlap with each other. For example, each end of the Ge semiconductor layer 505 is undercut by the same length, such as 5-10% at the length of the gate. In other words, the total undercut length of the both ends of the Ge semiconductor layer 505 is 10-20% of the gate length.

The Ge semiconductor layer 505 can be etched under the following conditions: wherein, etching can be performed at room temperature with a H$_2$O$_2$ and H$_2$O mixture of 3:97 molar ratio. More specific details about the etching process of the Ge semiconductor layer 505 can be found in N. Cernigila and P. Wang "Dissolution of Germanium in Aqueous Hydrogen Peroxide Solution", Journal of the Electrochemical Society, Vol. 109, No. 6 (1962) pp 508-512; and M. F. EHMAN, at al. "Characterisation of Thin Surface Films on Germanium in Various Solvents by Ellipsometery", Journal of materials science, 6 (1971), pp 969-973.

The etching step 420 can be omitted in some embodiments of this invention.

Figure 5C:
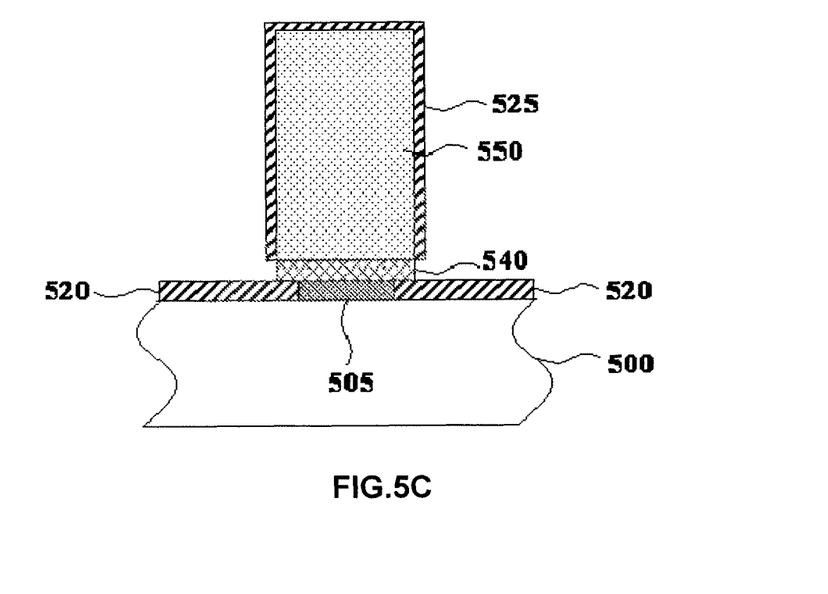

At step 430 of FIG. 4, a doped epitaxial semiconductor layer 520 is selectively and epitaxially grown on the opposite sides of the Ge semiconductor layer 505 to form raised source/drain extension regions (see FIG. 5C).

The step of selective epitaxial growth occurs at positions where "seed" atoms exist. Thus, a doped epitaxial semiconductor layer 520 is selectively and epitaxially grown on the opposite sides of the Ge semiconductor layer 505 in the step of selective epitaxial growth. The doped epitaxial semiconductor layer 520 will form raised source/drain extension regions. Meanwhile, an epitaxial semiconductor layer 525 covering the gate layer 550 is also formed in the selective epitaxial growing step (the epitaxial semiconductor layer 525 can be removed in a subsequent step).

In one embodiment, the material of the epitaxial semiconductor layer 520 is heavily doped Ge. For example, the selectively epitaxial growth can be carried out under the following conditions: the selective epitaxial growth can be carried out with rapid thermal CVD tools, in which the flow rate of $H_2$ is 10-50 sccm, preferably 30 slm; the flow rate of $GeH_4$ serving as a Ge source is 100-300 sccm; optionally, HCL can be introduced, the flow rate of which is, for example, 50-300 SCCM; an $AsH_3$ and $H_2$ mixture of molar ratio 1:99, a $B_2H_6$ and $H_2$ mixture of molar ratio 1:99, or a $PH_3$ and $H_2$ mixture of molar ratio 1:99, the flow rate of which is about 90 SCCM; the temperature is about 400-600° C., such as 500° C.; the pressure is about 0.05-1.0 torr, such as 0.07 torr. In one embodiment, $B_2H_6$ can be used as a dopant, the doping concentration of which is, for example, $5.0 \times 10^{19}$-$5.0 \times 10^{21}$ cm$^{-3}$.

Preferably, no preheating step is carried out in the epitaxial growing step 430, because hydrogen is usually used in preheating treatments at a temperature above 800° C., and even in a low temperature preheating treatment of 800° C., crystal defects may occur, for example, at the interface between a silicon oxide and the substrate (such as in the proximity of STI).

Due to the growth of intrinsic oxides, the queue time between etching step 420 and epitaxial growing step 430 preferably is not longer than 2 hours (that is, time interval between etching step 420 and epitaxial growing step 430), and more preferably, is not greater than 1 hour.

From the above processes, the formed semiconductor device (see FIG. 5C) comprises: a patterned stack on the semiconductor substrate 500, which comprises, from bottom to top, the Ge semiconductor layer 505, the gate dielectric layer 540 and the gate layer 550; and a doped epitaxial semiconductor layer 520 which is selectively and epitaxially grown on the opposite sides of the Ge semiconductor layer 505. Wherein, as described below, the epitaxial semiconductor layer 520 forms raised source/drain extension regions, and the Ge semiconductor layer 505 is used as a channel region.

In contrast to the prior art in which source/drain extension regions are formed through ion implantation and annealing, in the present invention, since the doped epitaxial semiconductor layer 520 is epitaxially formed to construct source/drain extension regions, the epitaxial semiconductor layer 520 (source/drain extension regions) may have a relatively higher doping concentration (i.e., heavily doped) of, for example, $5.0 \times 10^{19}$-$5.0 \times 10^{21}$ cm$^{-3}$. Further, dopants can be activated to a relatively larger extent, thus reducing crystal defects. In doing so, accumulation resistance can be advantageously reduced, and consequently, transistor driving current can be increased.

Also, as compared to the prior art in which source/drain extension regions are formed through ion implantation and annealing, in the present embodiments, since the doped epitaxial semiconductor layer 520 is epitaxially formed for the construction of source/drain extension regions, the epitaxial semiconductor layer 520 (that is, source/drain extension regions) may have a relatively smaller thickness of, for example, 5-50 nm. In some embodiments of the present invention, the thickness of the epitaxial semiconductor layer 520 is less than 20 nm, or even less than 10 nm, which can advantageously reduce its junction capacitance and therefore improve transistor performance.

Besides, laser melting/sub-melting annealing requires complicated process adjustment, and the high temperature in laser melting/sub-melting annealing processes (for example, above about 1300° C.) tends to introduce defects in the channel region. In contrast, in the present invention in which source/drain extension regions are formed through epitaxial growth, less channel region damage occurs thanks to the lower temperature of the epitaxial growth (for example, 620-800° C.)

Further, in the present invention, the source/drain extension regions are located above the surface of the semiconductor substrate 300, 500. Thus the source/drain extension regions formed are so-called raised source/drain extension regions, which can further reduce parasitic junction capacitance, and therefore further improve transistor performance.

In the prior art in which source/drain extension regions are formed through ion implantation and annealing, implanted dopants can diffuse in the vertical direction, as well as in the lateral direction, which is undesirable. In contrast, in the present invention, the lengths of source/drain extension regions can be well controlled through controlling the undercut amount of the Ge semiconductor layer 505. Thus, the invention further reduces the junction capacitor.

Figure 5D:
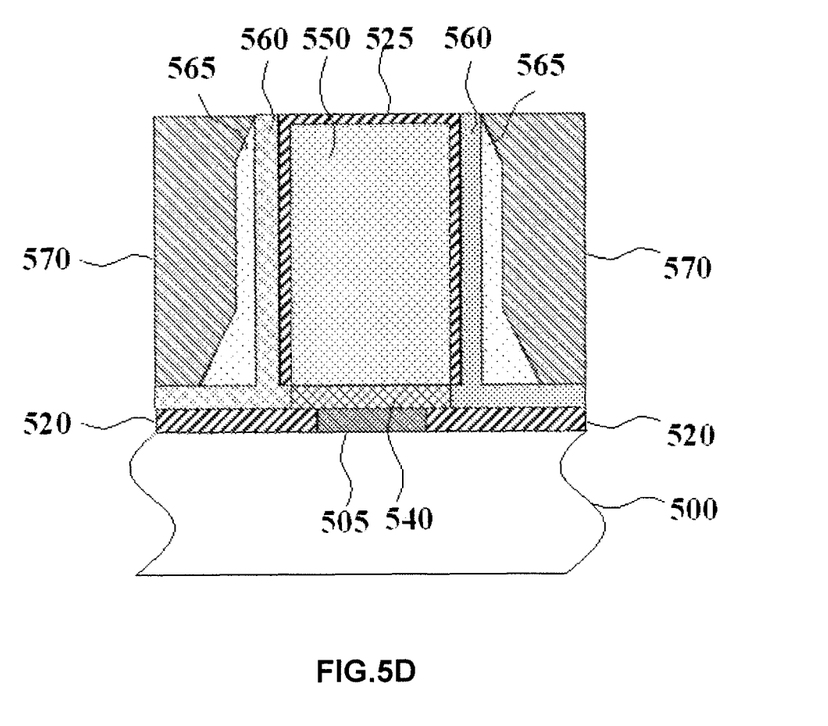

Upon forming the raised source/drain extension regions, as shown in FIG. 5D, sidewall spacers 560, 565 of the stack, an interlayer dielectric layer 570, and source/drain regions (not shown) can be formed.

While alternative materials can be used, the material of the sidewall spacers 560 and 565 and interlayer dielectric layer 570, and their manufacturing methods, the sidewall spacers 560, 565 for example, can be made of a silicon nitride and a silicon oxide, respectively, and can be formed through atom layer deposition (ALD) having excellent coverage and lower process temperature. Upon forming the sidewall spacers 560, 565 through deposition and etching, the interlayer dielectric layer 570 is deposited, and is then polished using chemical mechanical polishing (CMP) to get the structure shown in FIG. 5D.

In addition, source/drain regions (not shown) can be formed, for example, after formation of the sidewall spacers 560, 565 and before formation of the dielectric interlayer 570. The source/drain regions can be formed through conventional ion implantation and annealing processes, and other kinds of source/drain regions also can be formed, such as raised source/drain regions.

Figure 5E:
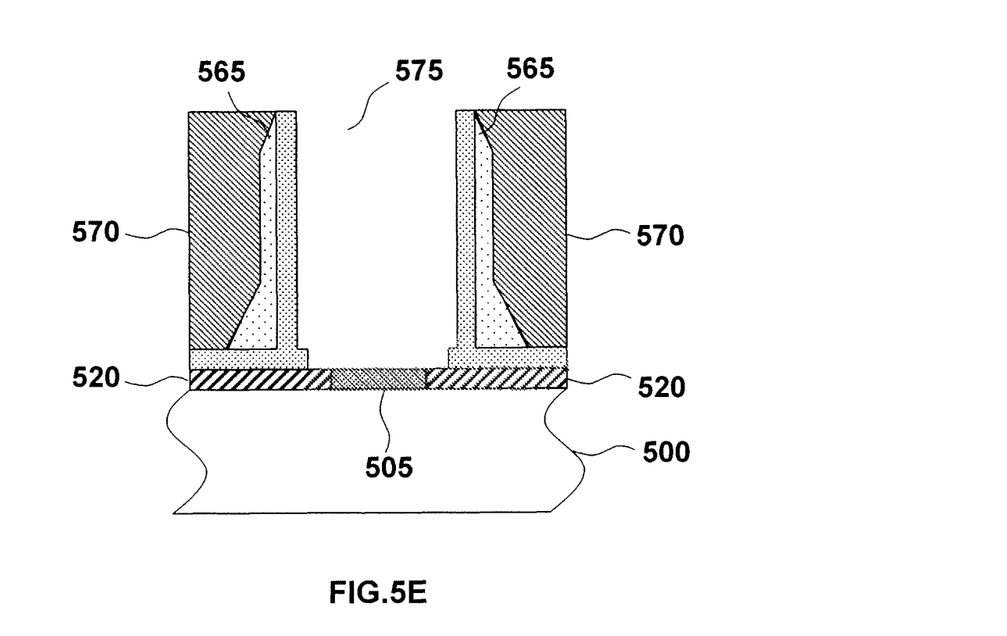
Figure 5F:
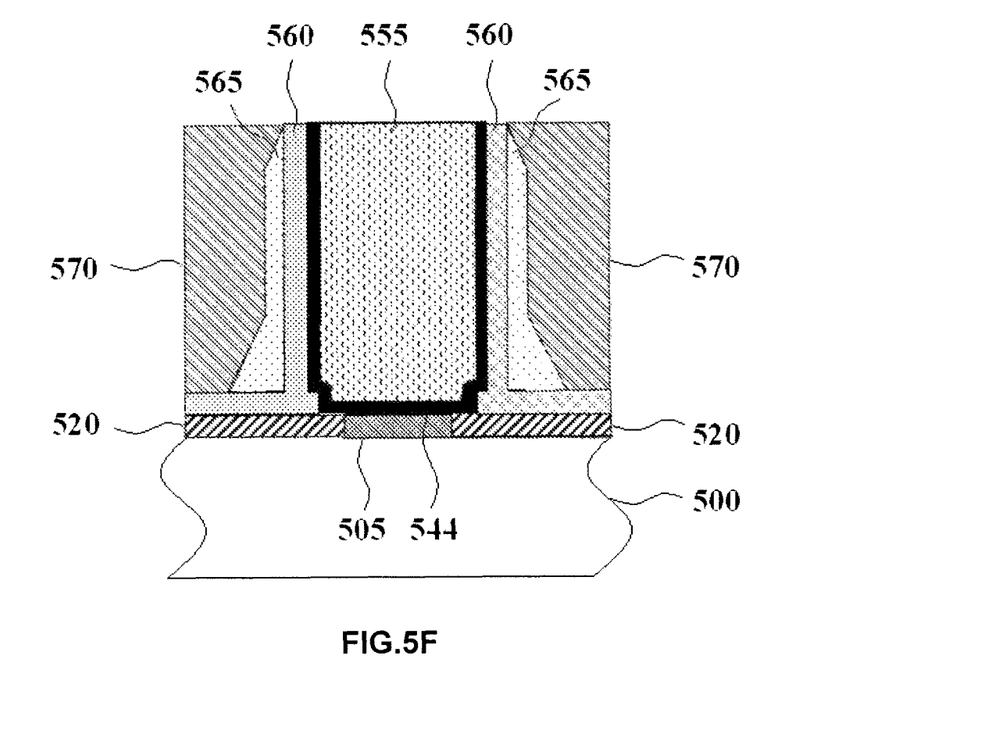

At step 440 of FIG. 4, the gate layer 550 and the gate dielectric layer 540 are substituted by a high K gate dielectric layer 544 and a metal gate layer 555, the Ge semiconductor layer 505 remaining as the channel region (see FIG. 5E-5F).

First, the gate layer 550 and the gate dielectric layer 540 are sequentially removed while retaining the Ge semiconductor layer 505, so as to form a recess 575 (see FIG. 5E).

While other methods can be used to remove the gate layer 550 and the gate dielectric layer 540, various methods, for example, including dry etching and wet etching can be used to selectively etch off the gate layer 550 and the gate dielectric layer 540 to form the recess 575. Further, the epitaxial semiconductor layer 525 surrounding the gate layer 550 is also removed.

Then, a high K gate dielectric layer 544 and a metal gate layer 555 are sequentially formed in recess 575 (see FIG. 5F).

While other materials can be used, the high K gate dielectric layer 544, can be for example, made of HfO, HfSiO, LaO, ZrO, ZrSiO, TaO, BST, BaTiO, SrTiO, YO, AlO, PbScTaO, PbZnNb and the like. The high K gate dielectric layer 544 has a thickness of, for example, less than 60 Å. As shown in FIG. 5F, the formed high K gate dielectric layer 544 covers not only the bottom of the recess 575, but also the sidewalls of the recess 575, so that, the high K gate dielectric layer 544 is of a substantially U shape.

After forming the high K gate dielectric layer 544 as a lining layer in the recess 575, a metal gate layer 555 is deposited and planarized in the recess 575, obtaining the structure shown in FIG. 5F consisted of the substantially U-shaped high K gate dielectric layer 544 and the metal gate layer 555 being surrounded by the high K gate dielectric layer 544. While other materials can be used for the metal gate layer 555, the n-type metal gate layer 555, for example, can be made of Hf, Zr, Ti, Ta, Al, HfC, ZrC, TiC, TaC, AlC and the like, having a work function of about 3.9-4.2 eV, and a thickness of about 100-2000 Å. The p-type metal gate layer 555, for example, can be made of Ru, Pa, Pt, Co, Ni, RuO and the like, having a work function of about 4.9-5.2 eV, and a thickness of about 50-1000 Å.

A semiconductor device is formed through the above processes (see FIG. 5F), in which, on the basis of the semiconductor device shown in FIGS. 5C and 5D, the gate dielectric layer 540 and the gate layer 550 are substituted by the high K gate dielectric layer 544 and the metal gate layer 555.

In process for last formation of the high K dielectric and gate of the present embodiment, after forming the epitaxial semiconductor layer 520 functioning as source/drain extension regions, the gate dielectric layer 540 is substituted by the high K dielectric layer 544, so as to avoid the degradation of high K dielectric layer caused by reducing gases released during the epitaxial growth. In contrast, in process for first forming a high K dielectric layer and gate, if source/drain extension regions are formed through an epitaxial method, the high K dielectric layer will be degraded due to a reduction reaction of the high K dielectric layer caused by reducing gases released during the epitaxial growth.

It is also possible to eliminate the substitution step 440 in some embodiment of the present invention.

Thus, the semiconductor device and its manufacturing method are set forth in the embodiments of the present invention have been described herein. Some specifics that are well known in the art are not provided in order to not obscure the ideas of the present invention. Those skilled in the art, based on the description herein can easily understand how to implement technical schemes disclosed herein.

Thus, the semiconductor device and its manufacturing method of the present invention have been described in detail. Some specifics that are well known in the art are not provided in order to not obscure the ideas of the present invention. Those skilled in the art, based on the description herein, will readily understand how to implement technical schemes disclosed herein.

Although some specific embodiments of the present invention have been demonstrated in detail with examples, it should be understood by persons skilled in the art that the above examples are only intended to be illustrative and not to limit the scope of the present invention. It should be understood by a person skilled in the art that the above embodiments can be modified without departing from the scope and spirit of the present invention. The scope of the appended claims therefore should be accorded the broadest interpretation so as to encompass all such modifications and similar arrangements and procedures.

What is claimed is:

1. A method of manufacturing a semiconductor device, comprising the following steps:
    forming a Ge-containing semiconductor layer on a semiconductor substrate;
    forming a patterned stack on the Ge-containing semiconductor layer, sequentially comprising from bottom to top a gate dielectric layer and a gate layer on the Ge-containing semiconductor layer;
    forming sidewall spacers and dielectric interlayers on the opposite sides of the stack;
    removing the gate dielectric layer and the gate layer to expose the underlying Ge-containing semiconductor layer;
    removing the exposed Ge-containing semiconductor layer to expose the semiconductor substrate and remaining portions of the Ge-containing semiconductor layer; and
    epitaxially growing a doped epitaxial semiconductor layer on the exposed semiconductor substrate between remaining portions of the Ge-containing semiconductor layer by using the remaining portions of the Ge-containing semiconductor layer as a seed layer, wherein a surface of the doped epitaxial semiconductor layer that is in contact with a surface of the substrate is coplanar with a surface of the exposed Ge-containing semiconductor layer that is in contact with the surface of the substrate.

2. The method according to claim 1, characterized in that the Ge-containing semiconductor layer is a P-type doped Ge epitaxial layer, having a doping concentration of 1E15-1E17 $cm^{-3}$.

3. The method according to claim 1, characterized in that the epitaxial semiconductor layer is an N-type doped Ge epitaxial layer, having a doping concentration of 1E13-1E15 $cm^{-3}$.

4. The method according to claim 1, characterized in that the step of removing the exposed portion of the Ge-containing semiconductor layer to expose at least a portion of the substrate comprises:
    removing the exposed Ge-containing semiconductor layer by a reactive ion etching process.

5. The method according to claim 1, characterized in that both the epitaxial semiconductor layer and the Ge-containing semiconductor layer have a thickness of 5-50 nm.

6. The method according to claim 5, characterized in that both of the epitaxial semiconductor layer and the Ge-containing semiconductor layer have a thickness of 20 nm.

7. The method according to claim 1, further comprising:
    after forming the epitaxial semiconductor layer,
    forming a high K gate dielectric layer and a metal gate layer on the epitaxial semiconductor layer.

8. The method according to claim 7, characterized in that the high K gate dielectric layer forms a U shape along a bottom and sidewalls of the metal gate layer.

* * * * *